United States Patent [19]
Kurtz et al.

[11] Patent Number: 5,359,214
[45] Date of Patent: Oct. 25, 1994

[54] FIELD EFFECT DEVICES FORMED FROM POROUS SEMICONDUCTOR MATERIALS

[75] Inventors: Anthony D. Kurtz, Teaneck, N.J.; Joseph S. Shor, Flushing, N.Y.; Alexander A. Ned, Bloomingdale, N.J.

[73] Assignee: Kulite Semiconductor Products, Leonia, N.J.

[21] Appl. No.: 71,669

[22] Filed: Jun. 2, 1993

[51] Int. Cl.$^5$ ............... H01L 29/80; H01L 29/06
[52] U.S. Cl. ............... 257/287; 257/263; 257/270; 257/279; 257/622
[58] Field of Search ............... 257/287, 261, 263, 266, 257/270, 272, 279, 622

[56] References Cited

U.S. PATENT DOCUMENTS

| | | | |
|---|---|---|---|
| 4,482,907 | 11/1984 | Jay | 257/287 |
| 5,111,254 | 5/1992 | Levinson et al. | 257/261 |

*Primary Examiner*—Mark V. Prenty
*Attorney, Agent, or Firm*—Plevy & Associates

[57] ABSTRACT

A field effect transistor device constructed in accordance with the present invention includes a channel of semiconductive material such as silicon having at least one row of pores extending therethrough. Internal pn junctions are fabricated within the porous region, such that the inside of each pore is coated with a layer of opposite conductivity type semiconductive material. When voltage is applied to the internal pn-junctions, the space charge around the pores widens or contracts, depending upon the direction of the bias, thereby permitting the modulation of current flow through the channel.

14 Claims, 4 Drawing Sheets

FIELD EFFECT DEVICES FORMED FROM POROUS SEMICONDUCTOR MATERIALS

REFERENCE TO RELATED APPLICATIONS

There are several co-pending applications, each of which are assigned to Kulite Semiconductors, Inc., the assignee herein, and each of which relate to the fabrication of semiconductor devices utilizing porous semiconductive materials. Reference is made herein to the following co-pending applications: U.S. patent application Ser. No. 07/957,519 filed on Oct. 6, 1992 and entitled POROUS SILICON CARBIDE AND RELATED METHODS AND APPARATUS; U.S. patent application Ser. No. 08/058,016, filed on May 7, 1993, and entitled SEMICONDUCTOR STRUCTURES HAVING ENVIRONMENTALLY ISOLATED ELEMENTS AND METHOD FOR MAKING SAME; and U.S. patent application Ser. No. 08/168,465, filed on Dec. 16, 1993, and entitled STRESS SENSITIVE PN JUNCTION DEVICES FORMED FROM POROUS SILICON AND METHOD FOR PRODUCING THE SAME.

FIELD OF THE INVENTION

This invention relates to semiconductor devices generally, and more particularly to field-effect devices partially fabricated using porous semiconductive materials.

BACKGROUND OF THE INVENTION

A field effect device, in its simplest form, comprises a conductive region of semiconductive material, such as silicon, which is modulated using electric fields. Such modulation can be used in transistor devices, such as a junction field effect transistor (JFET), to obtain a voltage variable resistor. As is well known, these devices have majority carrier flow through a conducting region or channel whose cross section can be varied by the application of an external electric field. There are two general types of JFETs, those which are "normally on" (i.e. operating in a depletion mode) wherein the space charge region thickness is significantly less than the channel thickness at zero voltage, and those [and those] which are "normally off" (i.e. operating in an enhancement mode) wherein the built-in potential is such that the channel is closed at zero applied voltage.

With reference now to FIG. 1, there is shown an n-channel junction field effect transistor (JFET) 2 fabricated, in accordance with the prior art, to operate in a depletion mode. As seen in FIG. 1, the prior art JFET consists of a channel of n-type semiconductive material 3, such as silicon, having gates 4 and 5 formed by diffusing a p-type impurity on opposite surfaces thereof. Ohmic contacts 6 and 7 are made to the ends of the channel 3, these forming the source and drain, respectively. Current $I_s$ is caused to flow along the length of the channel because of the voltage supply connected between source 6 and drain 7. This current consists of majority carriers, which in the illustrative device, are electrons. As is well known in the art, a negative gate voltage creates two high resistance regions 8 and 9 in the channel adjacent to the gates 4 and 5, respectively. The conductivity of these regions is nominally zero because of the unavailability of current carriers. Hence, the effective width of the channel in FIG. 1 will decrease with increasing reverse bias. When the pinch-off voltage is reached, the channel width is reduced to zero because all of the free charge has been removed from the channel.

Efforts in the prior art to improve upon the conventional planar field effect transistor have resulted in various modifications. In FIG. 2, there is shown a V-groove FET, which utilizes a non-planar structure to provide a higher transconductance and a lower turn-on resistance than the conventional planar FET. As shown in FIG. 2, the V-groove FET is typically formed from an n-type silicon epitaxial layer 3' on a p-type substrate 5'. The device has three sets of V-shaped grooves that form the gate G, drain D, and source S, and isolation regions. Numeral 4' refers to a p+ or Schottky barrier between an ohmic contact layer of aluminum and the n-channel. Because the equivalent channel length is smaller than the gate opening L, the channel conductance is larger than a planar FET with the same device geometry. In the saturation region, the device is pinched off at a point near the middle of the channel, instead of at the drain end as in the planar FET. The equivalent channel length in the saturation region is also less than the gate opening. Consequently, the transconductance is larger than that of the conventional planar FET. A primary disadvantage of the V-groove FET, however, is that it is a complex structure which is very expensive to manufacture.

Accordingly it is an object of the present invention to provide a FET device which exhibits high transconductance and a low turn-on resistance, yet which is simple and economical to manufacture. Other advantages of the present invention regarding superior operating conditions over the v-groove FET will be discussed.

SUMMARY OF THE INVENTION

In accordance with the present invention, the aforementioned object is accomplished utilizing a channel of semiconductive material having at least one row of pores extending therethrough. Internal pn junctions are fabricated within the pores, such that the inside of each pore is coated with a layer of opposite conductivity type material. When voltage is applied to the internal pn-junctions the space charge around the pores widens or contracts, depending upon the direction of the bias, thereby permitting the modulation of current flow through the channel. The porous region is thus modulated by an external electric field to control the current flow through the channel.

BRIEF DESCRIPTION OF THE DRAWINGS

The foregoing and other objects, features, and advantages of the invention will be apparent from the following more particular description of preferred embodiments of the invention, as illustrated in the accompanying drawings, wherein.

DETAILED DESCRIPTION OF THE INVENTION

Figure 3:
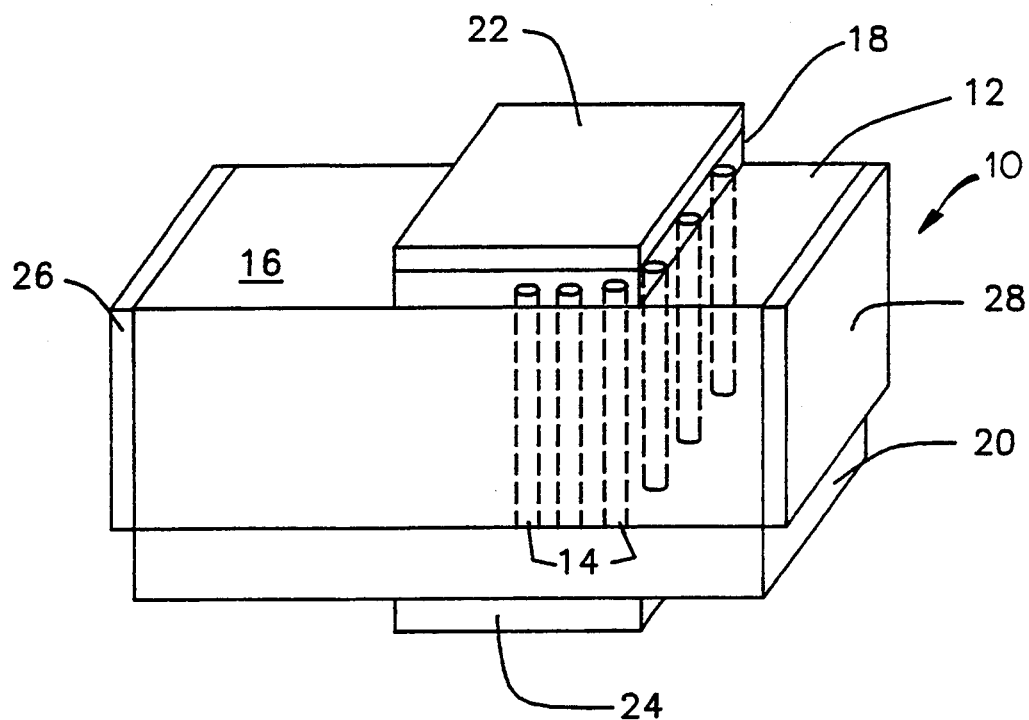
FIG. 3 is a perspective view of a FET device constructed in accordance with one embodiment of the present invention.

With reference now to FIG. 3, there is shown a FET device 10 which is capable of exhibiting high transconductance and low turn-on resistance and which is fabricated according to certain novel techniques which will be described subsequently. Numeral 12 references a channel or layer of semiconductor material doped n-type using a suitable impurity. It will of course be apparent that a p-channel device may be obtained by selecting a p-type dopant. The layer 12 has a porous region defined therein wherein pores 14 extend in a direction normal to surface 16 thereof and through the thickness of the layer. Although there are many rows of pores across the channel in the illustrative embodiment, there can, in principle, be as few as one row of pores. Because of the presence of the pores, the cross section of the channel available for current flow is reduced in these areas. Internal pn junctions are fabricated within the pores, such that the inside of the pores is coated with a layer of opposite conductivity type material. In the illustrative embodiment depicted in FIG. 3, the pores are coated with a layer of p-type material (not shown).

As shown in FIG. 3, p-type gates 18 and 20 are disposed on the upper and lower surfaces of the channel. Ohmic contacts 22 and 24 are formed thereon and on opposite ends of the channel to provide source and drain connections 26 and 28, respectively. When voltage is applied to the internal pn-junctions, the space charge around the pores widens or contracts, depending upon the direction of the bias, thereby permitting the modulation of current flow through the channel. The criteria of pore diameter, pore spacing, and channel resistivity are different for the depletion mode and enhancement mode configurations. For instance, for the depletion mode the pore spacing must be sufficiently large such that some reasonable voltage is required to close the channel. From this voltage, one can approximate the voltage required to for the resulting space charge to close of the channel. For the enhancement mode, however, the opposite is true. For zero applied voltage, the built in potential will be sufficient to completely close off the channel because the space charge region of adjacent pores will overlap. The interpose spacing must be chosen such that a relatively small forward bias on the gate junction will be sufficient to at least partially open the channel. When the current flows from source to drain ($V_g=0$) in a depletion mode JFET, not only will there be a space charge widening from the top and bottom gate junctions along the length of the channel, but also of the space charge region around each pore. Depending on the voltage drop from drain to source, there will be more or less space charge widening. If it is assumed that the source to drain current is flowing in the x-direction, then it should be readily apparent that not only will there be space charge widening in the z-direction, but also in the xy-plane around each pore. It is therefore clear that this structure is much more efficient for causing pinch-off for any channel length or thickness than a conventional structure. When gate voltage is applied, not only will there be a further spreading of the space charge across the entire length of the channel (z-direction), but also in the xy-plane increasing rapidly from each pore. Both of these widenings of the space charge are independent of channel length. By proper choice of pore diameter depth of the internal pn-junction channel doping, and thickness of the channel, the porous region can be pinched off by the gate voltage independently of the source to drain voltage drop. Because of the nature of the space charge widening in the porous structure, it is clear that the transconductance of such a device (i.e. $dI_d/dV_g$) is enhanced giving rise to a more efficient transistor. It should also be appreciated that for the case of a pinch-off in the porous region, the effective length of the device will be on the order of the interpose spacing. Because of the small interpose distance, this will also give rise to a higher transconductance and improved frequency response.

For an enhancement mode transistor, many of the same advantages occur. In an enhancement mode transistor, the presence of the built in potential at zero gate voltage gives rise to a space charge region large enough to pinch off the device. In the case of the porous structure, the device is designed such that this only occurs in the porous region. This is controlled by the conductivity of the channel material, the interpose spacing, and the junction depth of the internal pn-junction. It should be noted that by proper choice of channel thickness, only the porous area is pinched off. Since the pinch-off at zero gate voltage occurs in the pore to pore regions, the transconductance of such a device will also be enhanced to again give rise to a more efficient transistor.

Figure 4:
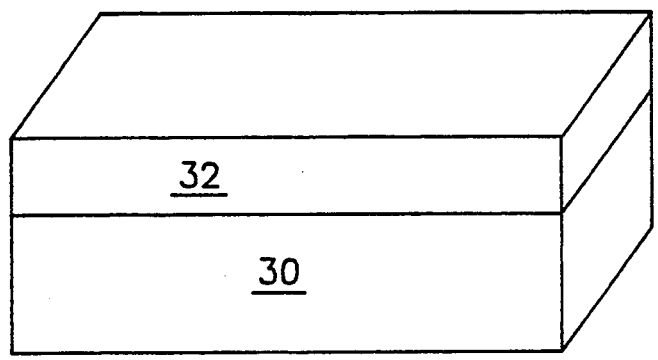
FIGS. 4–8 illustrate various processing steps in accordance with one technique for fabricating an FET device in accordance with the present invention.
Figure 5:
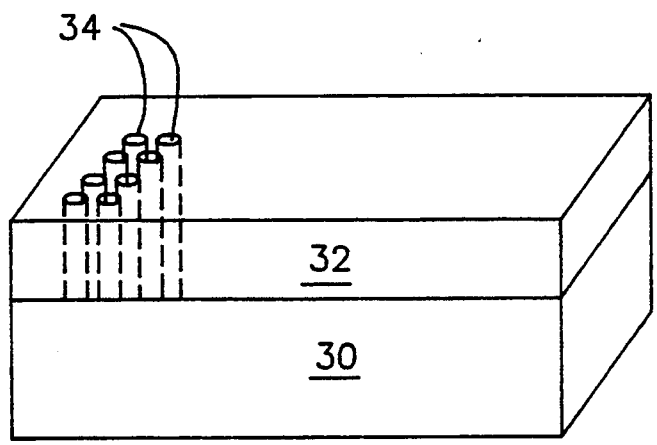

A typical process for fabricating an n-channel JFET from a p-type wafer of silicon in accordance with the present invention will now be described. It will of course be understood that any suitable semiconductive material, such as silicon carbide or gallium arsenide may be used and that the conductivity type of the initial wafer will depend upon whether an n-channel or a p-channel configuration is desired. Referring now to FIG. 4, there is shown a p-type wafer 30 having thereon an n-type epilayer 32 grown to a thickness of one to five microns, or some other suitable thickness. The epilayer is masked with photoresist, patterned, and pores are etched therein using a conventional procedure. The resulting structure is shown in FIG. 5. Although the formation of pores 34 in the epilayer 32 can be accomplished through electrochemical anodization or various other process, reactive ion etching is the preferred technique.

Figure 6:
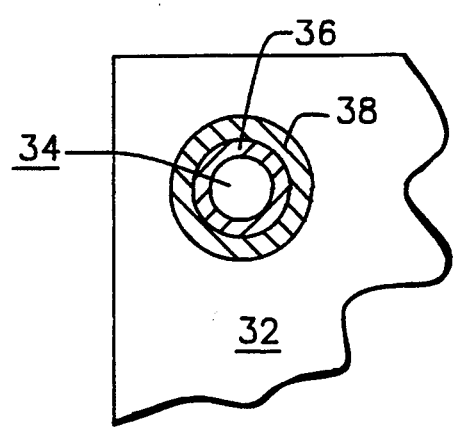
Figure 7:
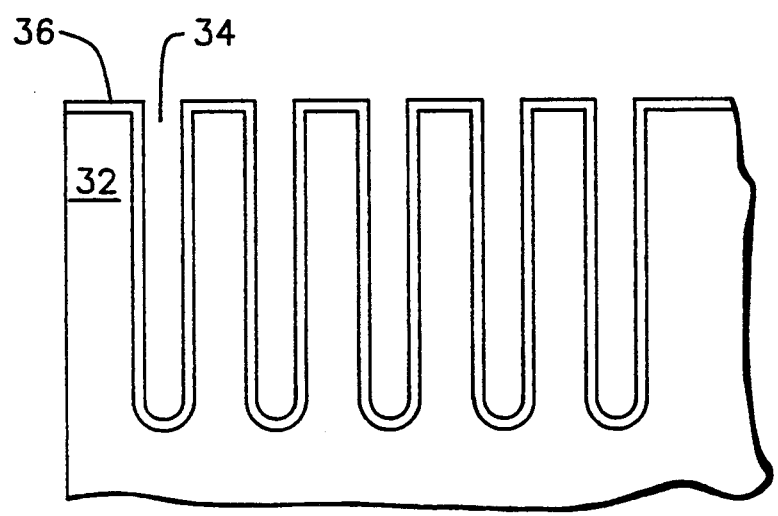

Subsequent to the etching process, the wafer 30 is diffused or otherwise doped with boron or other suitable p-type impurity to form a p-type skin 36 along the inner diameter of the pores and on the surface of the epilayer 32. This results in the formation of a plurality of internal pn-junctions. Typically, the diffusion should take place for several minutes at 700°–900° C. to obtain a very thin skin which may have a thickness on the order of 500 angstroms. In FIG. 6, the interior of the pore is shown in plan view. As seen in FIG. 6, a space charge layer 38 surrounds the p-type skin 36. FIG. 7 shows a cross section of what a row of pores looks like after the diffusion.

Figure 8:
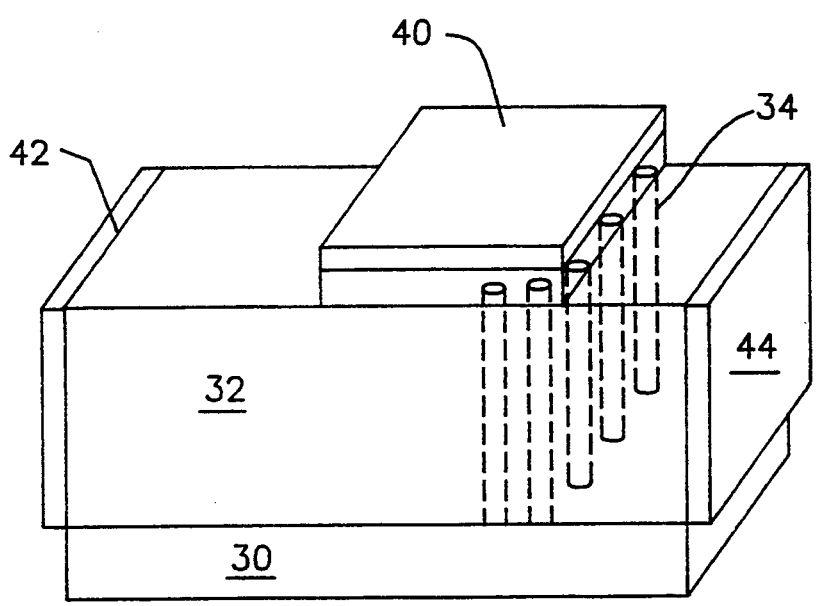

Following the diffusion step, a p-type epilayer 40 (FIG. 8) is grown on top of the pores 34. Epilayer 40 will serve as the gate. It should be readily apparent to those of ordinary skill in the art that the p-type epilayer could also have been used, as an alternative to the diffusion technique described above, to coat the inner surfaces of the pores and thereby form the internal pn-junctions. Using a conventional metallizing technique, the structure is metallized to form ohmic contacts 42 and 44 thereon, which contacts serve as the source and drain respectively. The gate contacts (not shown) are also formed during the metallization step.

Figure 9:
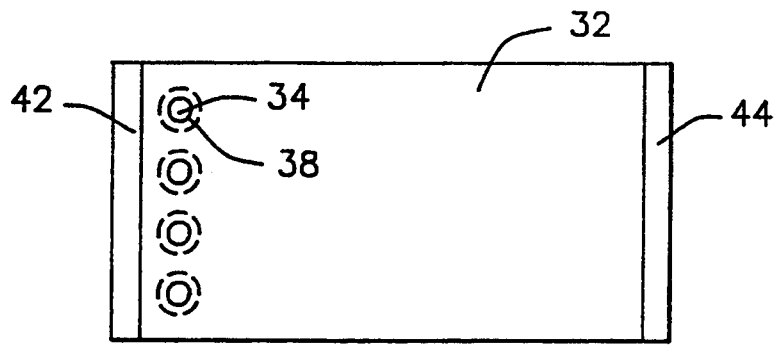
FIGS. 9 and 10 are cross sectional views illustrating the phenomenon of space charge widening which results in opening and closing of the inventive porous FET channel region.
Figure 10:
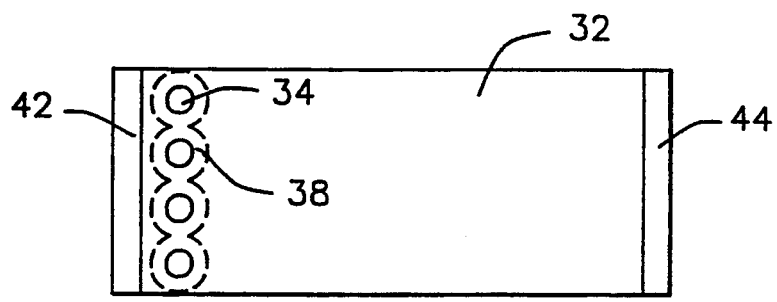

The controlling channel of the illustrative JFET device consists of the region 36 between the space charge layers 38 surrounding each pore, as shown in FIG. 6. The relative distance between the space charge layers 38 in FIG. 9 reflects the condition in which the gate and/or source to drain voltage is such that the controlling channel is open. When the channel is closed, the space charge layers overlap, as shown in FIG. 10. Although only one row of pores is shown in FIGS. 9 and 10, it should be readily apparent to those familiar with the art that multiple rows of pores may be employed. It should also be appreciated that the position of the pores with respect to the source and the drain contact along the overall channel will change the effect of the space charge widening caused by the source to drain current.

Figure 11:
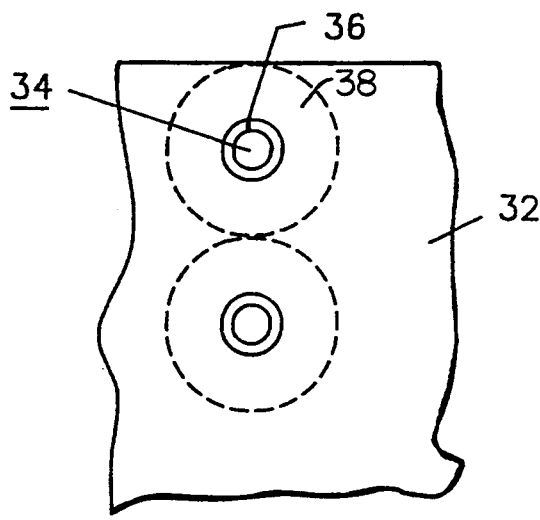
FIGS. 11 and 12 are partial sectional views showing the widening and contraction of the space charge layers around each pore.
Figure 12:
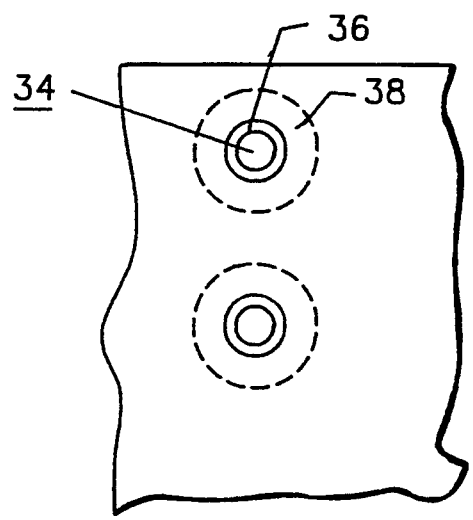

In the structure illustrated in FIGS. 9 and 10, there will be a greater potential drop across the porous row when the device is in or near pinch-off than when the channel is wide open. This phenomenon is illustrated in FIGS. 11 and 12. With reference first to FIG. 11, it will be observed from the size of the space charge layers 38 that the device is near pinch-off, and thus the resistance of the channel between the pores 34 is very high. This resistance may be much higher than the resistance of the rest of the channel, or it may be a more significant fraction of the total resistance of the channel than that depicted in FIG. 12, where the channel between pores is wide open. One can thus define an "effective length" of the channel in terms of the amount of space in the narrow channel area between the pores. Because this length is much shorter that the total length of the channel and can be more resistive, it will result in a higher transconductance in the device, since the transconductance is inversely proportional to the length of the channel.

Because of the importance of the spacing between the space charge layers in defining the effective length of the channel, it should be understood that the pore diameters, interpose spacings, and channel resistivity will depend on what type of transistor is being fabricated. For purposes of illustration, a typical channel configuration could employ a pore size of 3000 angstroms, interpose spacings of 7000 angstroms, a channel doping level of $5 \times 10^{16}/cm^3$ and a total channel length of 25 microns.

Figure 1:
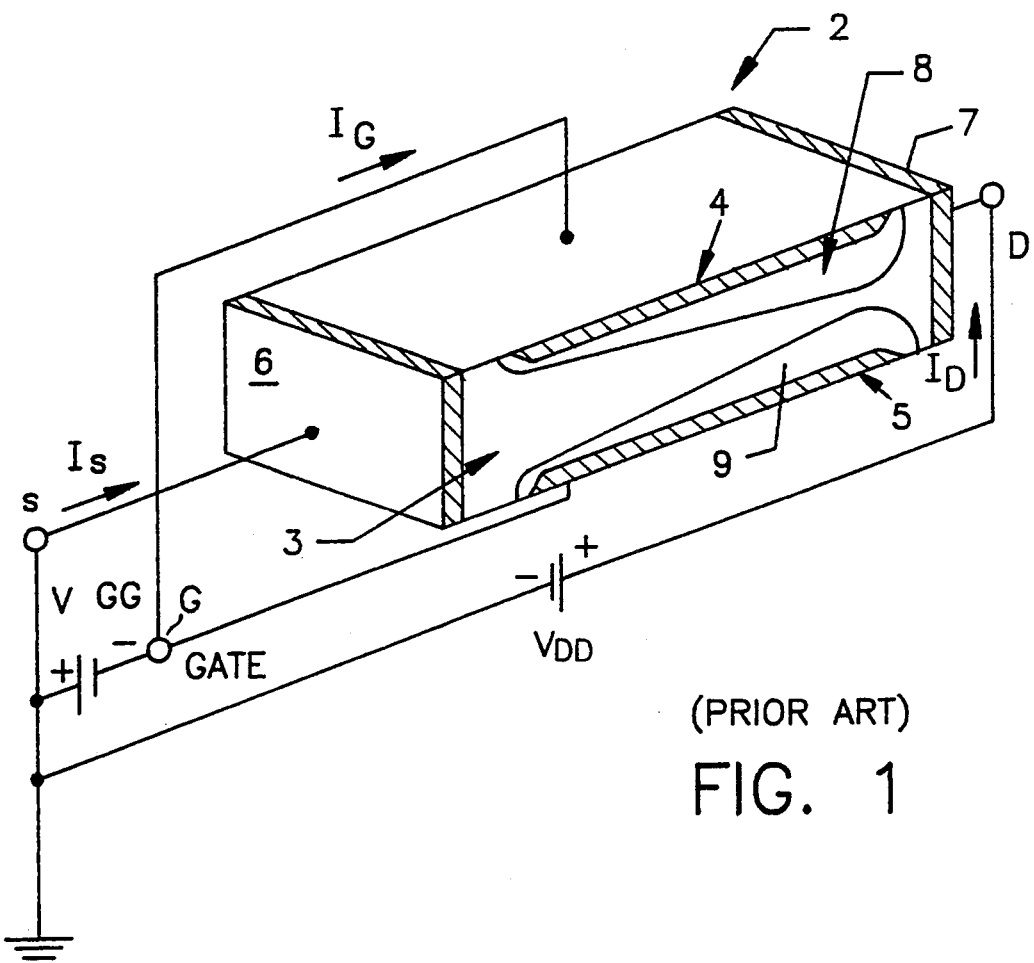
FIG. 1 is a view of a perspective view of a conventional, planar field effect semiconductor device.
Figure 2:
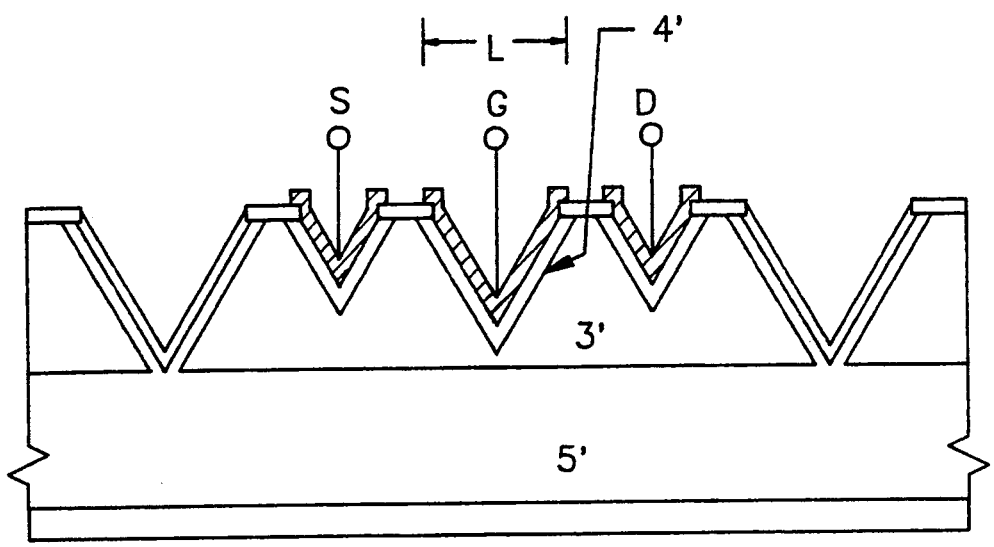
FIG. 2 is a view of a cross sectional view of a second prior art FET device utilizing a V-groove gate.

The FET device of the present invention offers substantial advantages over prior art FET devices, particularly when it is compared to the V-groove configuration depicted in FIG. 2. For example, an FET constructed with a porous channel region in accordance with the present invention will exhibit a substantially higher transconductance because the V-groove consumes a higher fraction of the total channel than the pores do for the same effective length. Moreover, in the V-groove FET, the channel is effectively defined by the height of the material left after the groove is etched, that is, the distance between the point of the groove and the bottom of the channel. This distance is determined by the width of the channel opened in the mask to etch the groove and the thickness of the channel layer. As these quantities are both large in comparison to the final height of the channel, any small error will cause a large error in the final channel height. In an FET employing a porous channel in accordance with the present invention, the error in the channel dimension will be on the same order of magnitude as the error in fabrication. Therefore, FET devices employing the inventive porous channel of the present invention are much easier to fabricate.

FET devices constructed in accordance with the present invention also permit a high degree of design flexibility which is not afforded by the prior art. For example, multiple rows of pores may be utilized in the channel of the present invention to pinch-off flow along the entire length thereof. This cannot be done in a V-groove FET since the V-groove is angled. Moreover, in the V-groove FET, the anisotropic etching of the groove proceeds at a 54.7° angle. Therefore, the length of the channel must be increased in order to compensate for this. Contrastingly, in FETs constructed in accordance with the present invention, the etching is essentially vertical, and thus the device can be scaled smaller. Size constraint becomes especially significant when comparing a channel utilizing groups of rows of pores to one embodying an arrangement of several grooves. Another design advantage enjoyed by FET devices employing a porous channel region is that it is possible to make the row of pores very close to the source or very close to the drain. This will reduce or enhance the pinch-off voltage. In the V-groove FET, the anisotropic nature of the etching prevents the fabrication of the groove close to either the source or the drain and thereby limits the flexibility of the control of the current-voltage characteristics. In addition, V grooves while possible in silicon, are extremely difficult to fabricate in such semiconductors as silicon carbide or GaAs, but the fabrication of porous material with internal junctions is easily achieved in these materials.

Other advantages, such as improved frequency response and ease of switching will be apparent to anyone skilled in the art of FET circuit design. It should be understood that the embodiment described herein, including the type of semiconductive materials used and the technique for forming the internal p-n junctions in the channel layer, is merely exemplary and that a person skilled in the art may make many variations and modifications to the described embodiments utilizing functionally equivalent elements to those described. Any variations or modifications to the invention just described are intended to be included within the scope of said invention as defined by the appended claims.

What is claimed is:

1. A field effect semiconductor device comprising a channel formed from a layer of semiconductor material of a first conductivity type, said channel including a porous region having internal pn junctions formed therein, said device further including first and second gate means disposed on opposed surfaces of said channel, said gate means being comprised of semiconductor material having a conductivity type opposite that of the channel.

2. The device according to claim 1, wherein said semiconductive material is selected from a group consisting of silicon, silicon carbide, and gallium arsenide.

3. The device according to claim 1, wherein one of said gate means is formed from a substrate of p-type semiconductor material and said channel is formed by growing an epilayer of n-type semiconductor material thereon.

4. The device according to claim 1, wherein said porous region defines at least one row of pores extending through said channel.

5. The device according to claim 4, wherein said pores are defined by reactive ion etching.

6. The device according to claim 4, wherein said internal pn-junction comprises a region of semiconductor material doped to a conductivity type opposite that of the channel.

7. A field effect semiconductor device comprising:
a channel of semiconductor material having a first conductivity type, said channel including a porous region defining a plurality of transversely extending pores, the interior surface of each of said pores being coated by a thin layer of semiconductive material having a second conductivity type, thereby defining a plurality of internal pn-junctions;
gate means formed on opposed surfaces of said channel, said gate means being of said second conductivity type and being in contact with said porous region; and
first and second ohmic contacts disposed on opposed lateral surfaces of said channel, said first and second ohmic contacts comprising a source and a drain, respectively.

8. A device according to claim 7, wherein said channel is comprised of n-type silicon and said gate means is comprised of p-type silicon.

9. A device according to claim 7, wherein said pores extend through said opposed surfaces wherein a surface portion of each of said gate means contacts the thin layers coating said pores.

10. A device according to claim 9, wherein said porous region defines a plurality of space charge regions circumscribing each internal pn-junction, wherein the thickness of each space charge region is adapted to vary upon the application of a voltage bias between said source and drain.

11. A device according to claim 7, wherein said porous region defines at least one row of pores.

12. A field effect semiconductor device comprising:
a channel of semiconductor material of a first conductivity type, said channel defining a plurality of pores each extending from a porous surface portion thereof and each being coated with an internal layer of semiconductor material of a second conductivity type to form respective pn-junctions; and
gate means including a layer of semiconductor material of said second conductivity type disposed on said porous surface portion and in contact with each internal layer.

13. A device according to claim 12, wherein said gate means further includes a second layer of semiconductor material of said second conductivity disposed on a surface of said channel opposite said porous surface portion.

14. A device according to claim 13, wherein said pores extend through said channel, wherein a surface portion of said first and second layers contacts each of said internal layers at ends thereof.

* * * * *